(12) United States Patent
Liu et al.

(10) Patent No.: US 12,069,801 B2
(45) Date of Patent: Aug. 20, 2024

(54) PHASE SHIFTER, ANTENNA, AND BASE STATION

(71) Applicant: HUAWEI TECHNOLOGIES CO., LTD., Guangdong (CN)

(72) Inventors: Xinming Liu, Xi'an (CN); Junfeng Lu, Xi'an (CN); Zhenxing Wan, Xi'an (CN); Weimin Li, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 311 days.

(21) Appl. No.: 17/479,397

(22) Filed: Sep. 20, 2021

(65) Prior Publication Data

US 2022/0007503 A1 Jan. 6, 2022

Related U.S. Application Data

(63) Continuation of application No. PCT/CN2020/080360, filed on Mar. 20, 2020.

(30) Foreign Application Priority Data

Mar. 20, 2019 (CN) .......................... 201910213308.7

(51) Int. Cl.
*H05K 1/02* (2006.01)
*H01P 1/18* (2006.01)
(Continued)

(52) U.S. Cl.
CPC ............ *H05K 1/0271* (2013.01); *H01P 1/18* (2013.01); *H01Q 1/12* (2013.01); *H05K 1/0243* (2013.01);
(Continued)

(58) Field of Classification Search
CPC .............. H05K 1/0271; H05K 1/0243; H05K 2201/068; H05K 2201/10098; H01P 1/18; H01Q 1/12; H01R 12/55
See application file for complete search history.

(56) References Cited

U.S. PATENT DOCUMENTS

| 3,388,350 | A | 6/1968 | Butler |
| 7,109,820 | B1 | 9/2006 | Lucas et al. |

(Continued)

FOREIGN PATENT DOCUMENTS

| CN | 101414601 A | 4/2009 |
| CN | 102045981 A | 5/2011 |

(Continued)

OTHER PUBLICATIONS

Office Action issued in Chinese Application No. 201910213308.7 on Mar. 1, 2021, 18 pages (with English translation).

(Continued)

*Primary Examiner* — Keith Ferguson
(74) *Attorney, Agent, or Firm* — Fish & Richardson P.C.

(57) ABSTRACT

The present disclosure relates to phase shifters, antennas, and base stations. One example phase shifter includes a cavity, a built-in printed circuit board (PCB), and a stress relief portion. The stress relief portion is connected to the PCB, and the stress relief portion is configured to reduce a stress generated due to different coefficients of thermal expansion (CTE) of the cavity and the PCB.

9 Claims, 5 Drawing Sheets

(51) Int. Cl.
*H01Q 1/12* (2006.01)
*H01R 12/55* (2011.01)
*H04W 88/08* (2009.01)

(52) U.S. Cl.
CPC ............. *H01R 12/55* (2013.01); *H04W 88/08* (2013.01); *H05K 2201/068* (2013.01); *H05K 2201/10098* (2013.01)

(56) References Cited

U.S. PATENT DOCUMENTS

2016/0372809 A1* 12/2016 Liu ........................ H01P 1/18
2019/0044258 A1* 2/2019 Everest .................. H05K 1/14

FOREIGN PATENT DOCUMENTS

| CN | 102222811 | A | 10/2011 |
| CN | 103633530 | A | 3/2014 |
| CN | 103972618 | A | 8/2014 |
| CN | 204011623 | U | 12/2014 |
| CN | 105765715 | A | 7/2016 |
| CN | 106067577 | A | 11/2016 |
| CN | 107809874 | A | 3/2018 |
| CN | 107864549 | A | 3/2018 |
| CN | 207303303 | U | 5/2018 |
| CN | 108573885 | A | 9/2018 |
| DE | 19902248 | A1 | 7/2000 |
| JP | H04119108 | U | 10/1992 |
| JP | H088834 | A | 1/1996 |
| JP | 2000332543 | A | 11/2000 |
| JP | 2002289723 | A | 10/2002 |
| JP | 3641226 | B2 * | 4/2005 |
| JP | 2008167113 | A | 7/2008 |
| JP | 2009200717 | A | 9/2009 |
| WO | WO-2016205995 | A1 * | 12/2016 ................ H01P 1/18 |

OTHER PUBLICATIONS

PCT International Search Report and Written Opinion issued in International Application No. PCT/CN2020/080360 on Jun. 19, 2020, 16 pages (with English translation).
Extended European Search Report issued in European Application No. 20772668.8 on Feb. 25, 2022, 9 pages.
Office Action issued in Chinese Application No. 201910213308.7 on Mar. 2, 2022, 7 pages.
Office Action issued in Chinese Application No. 201910213308.7 on Aug. 1, 2022, 4 pages.

* cited by examiner

PHASE SHIFTER, ANTENNA, AND BASE STATION

CROSS-REFERENCE TO RELATED APPLICATION

This application is a continuation of International Application No. PCT/CN2020/080360, filed on Mar. 20, 2020, which claims priority to Chinese Patent Application No. 201910213308.7, filed on Mar. 20, 2019. The disclosures of the aforementioned applications are hereby incorporated by reference in their entireties.

TECHNICAL FIELD

Embodiments of this application relate to mobile communications technologies, and in particular, to a phase shifter, an antenna, and a base station.

BACKGROUND

With development of a base station antenna, a length of a phase shifter used in the base station antenna keeps increasing. In this way, a distance between solder joints distributed at two ends of the phase shifter also becomes longer.

When a coefficient of thermal expansion (CTE) of a cavity of the phase shifter is inconsistent with that of an internal conductive apparatus of the phase shifter, in a long-term temperature cycle test, the solder joints distributed at the two ends of the phase shifter often creep, resulting in tearing of the solder joints. In addition, the longer the length of the phase shifter, the more easily the solder joints are torn, which further affects electrical performance stability of the phase shifter.

SUMMARY

Embodiments of this application provide a phase shifter, an antenna, and a base station, to avoid tearing a solder joint on the phase shifter, and ensure electrical performance stability of the phase shifter.

To achieve the foregoing objective, the embodiments of this application provide the following technical solutions.

According to a first aspect, an embodiment of this application provides a phase shifter, including:
a cavity and a built-in printed circuit board (PCB) thereof; and
a stress relief portion, where the stress relief portion is connected to the PCB, and the stress relief portion is configured to reduce a stress generated due to different coefficients of thermal expansion of the cavity and the PCB.

Because the stress relief portion can be configured to reduce the stress generated due to the different coefficients of thermal expansion of the cavity and the PCB, adding the stress relief portion in the phase shifter can avoid tearing a solder joint on the phase shifter, thereby ensuring electrical performance stability of the phase shifter.

In a possible implementation, the stress relief portion may include a structural connection portion, where the structural connection portion is structurally connected to a second strip on the PCB, a first strip and the second strip are independent of each other, and the first strip is used for internal conduction of the phase shifter. That is, the structural connection portion is a specific implementation of the stress relief portion. The structural connection portion is used to protect the solder joint and block the stress generated due to the different coefficients of thermal expansion of the cavity and the PCB.

In a possible implementation, the structural connection portion is close to the solder joint. Optionally, the solder joint is a solder joint located at any end of the phase shifter.

In a possible implementation, the stress relief portion may include an elastic mechanical part. The elastic mechanical part is electrically connected to the first strip on the PCB, and the first strip is used for the internal conduction of the phase shifter. In this implementation, the elastic mechanical part is a specific implementation of the stress relief portion. The elastic mechanical part is used to absorb the stress generated due to the different coefficients of thermal expansion of the cavity and the PCB.

In a possible implementation, a shape of the elastic mechanical part may include but is not limited to at least one of the following shapes:
an M-shape, a W-shape, a V-shape, a zigzag, an inverted V-shape, and a fold line shape.

In a possible implementation, the stress relief portion may include a slot, where the slot is located on a side of the solder joint on the phase shifter and close to a central position of the PCB. In this implementation, the slot is a specific implementation of the stress relief portion. The slot is used to cut the stress generated due to the different coefficients of thermal expansion of the cavity and the PCB.

In a possible implementation, a depth of the slot is greater than or equal to H, the depth of the slot is less than or equal to a width of the PCB, and H is a half of the width of the PCB.

In a possible implementation, the slot and the first strip on the PCB are independent of each other, and the first strip is used for the internal conduction of the phase shifter.

In a possible implementation, the first strip is a suspended strip.

According to a second aspect, an embodiment of this application provides a phase shifter, including:
a cavity and a built-in PCB thereof; and
a slot, where the slot is located on a side of a solder joint on the phase shifter and close to a central position of the PCB, and the slot is configured to reduce a stress generated due to different coefficients of thermal expansion of the cavity and the PCB.

Because the slot can be configured to reduce the stress generated due to the different coefficients of thermal expansion of the cavity and the PCB, the slot is added in the phase shifter, and the slot is located on the side of the solder joint on the phase shifter and close to the central position of the PCB. The slot is used to cut the stress generated due to the different coefficients of thermal expansion of the cavity and the PCB, to avoid tearing of the solder joint on the phase shifter, thereby ensuring electrical performance stability of the phase shifter.

In a possible implementation, a depth of the slot is greater than or equal to H, the depth of the slot is less than or equal to a width of the PCB, and H may be a half of the width of the PCB or another width.

In a possible implementation, the slot and a first strip on the PCB are independent of each other.

According to a third aspect, an embodiment of this application provides a phase shifter, including:
a cavity and a built-in PCB thereof; and
a structural connection portion, where the cavity is structurally connected to a second strip on the PCB by using the structural connection portion, a first strip and the second strip are independent of each other, and the first strip is used for internal conduction of the phase shifter; and the struaural connection portion is configured to reduce a stress generated due to different coefficients of thermal expansion of the cavity and the PCB.

Because the structural connection portion can be configured to reduce the stress generated due to the different coefficients of thermal expansion of the cavity and the PCB, the structural connection portion is added in the phase shifter, and the structural connection portion is structurally connected to the second strip on the PCB. The first strip and the second strip are independent of each other. The structural connection portion is used to protect a solder joint and block the stress generated due to the different coefficients of thermal expansion of the cavity and the PCB, to avoid tearing of the solder joint on the phase shifter, thereby ensuring electrical performance stability of the phase shifter.

In a possible implementation, the structural connection portion is close to the solder joint. Optionally, the solder joint is a solder joint located at any end of the phase shifter.

According to a fourth aspect, an embodiment of this application provides a phase shifter, including:

a cavity and a built-in PCB thereof; and
an elastic mechanical part, where the elastic mechanical part is electrically connected to a first strip on the PCB, the first strip is used for internal conduction of the phase shifter, and the elastic mechanical part is configured to reduce a stress generated due to different coefficients of thermal expansion of the cavity and the PCB.

Because the elastic mechanical part can be configured to reduce the stress generated due to the different coefficients of thermal expansion of the cavity and the PCB, the elastic mechanical part is added in the phase shifter, and the elastic mechanical part is electrically connected to the first strip on the PCB. The first strip is used for the internal conduction of the phase shifter. The elastic mechanical part is used to absorb the stress generated due to the different coefficients of thermal expansion of the cavity and the PCB, to avoid tearing a solder joint on the phase shifter, thereby ensuring electrical performance stability of the phase shifter.

In a possible implementation, one end of the elastic mechanical part is electrically connected to an inner core of an external cable, an outer conductor of the external cable is electrically connected to the cavity, and the other end of the elastic mechanical part is electrically connected to the first strip.

In a possible implementation, one end of the elastic mechanical part is electrically connected to an inner core of an adapter, the inner core of the adapter is connected to an inner core of an external cable, an outer conductor of the external cable is electrically connected to the cavity, and the other end of the elastic mechanical part is electrically connected to the first strip.

In a possible implementation, a shape of the elastic mechanical part may include but is not limited to at least one of the following shapes: an M-shape, a W-shape, a V-shape, a zigzag, an inverted V-shape, a fold line shape, or the like.

According to a fifth aspect, an embodiment of this application provides an antenna, including a phase shifter, where the phase shifter includes:

a cavity and a built-in PCB thereof; and
a stress relief portion, where the stress relief portion is connected to the PCB, and the stress relief portion is configured to reduce a stress generated due to different coefficients of thermal expansion of the cavity and the PCB.

Because the stress relief portion can be configured to reduce the stress generated due to the different coefficients of thermal expansion of the cavity and the PCB, adding the stress relief portion in the phase shifter can avoid tearing a solder joint on the phase shifter, thereby ensuring electrical performance stability of the phase shifter.

In a possible implementation, the stress relief portion may include a structural connection portion, where the structural connection portion is structurally connected to a second strip on the PCB, a first strip and the second strip are independent of each other, and the first strip is used for internal conduction of the phase shifter. That is, the structural connection portion is a specific implementation of the stress relief portion. The structural connection portion is used to protect the solder joint and block the stress generated due to the different coefficients of thermal expansion of the cavity and the PCB.

In a possible implementation, the: structural connection portion is close to the solder joint. Optionally, the solder joint is a solder joint located at any end of the phase shifter.

In a possible implementation, the stress relief portion may include an elastic mechanical part, where the elastic mechanical part is electrically connected to the first strip on the PCB, and the first strip is used for the internal conduction of the phase shifter. In this implementation, the elastic mechanical part is a specific implementation of the stress relief portion. The elastic mechanical part is used to absorb the stress generated due to different coefficients of thermal expansion of the cavity and the PCB.

In a possible implementation, one end of the elastic mechanical part is electrically connected to an inner core of an external cable, an outer conductor of the external cable is electrically connected to the cavity, and the other end of the elastic mechanical part is electrically connected to the first strip.

In a possible implementation, one end of the elastic mechanical part is electrically connected to an inner core of an adapter, the inner core of the adapter is connected to an inner core of an external cable, an outer conductor of the external cable is electrically connected to the cavity, and the other end of the elastic mechanical part is electrically connected to the first strip.

In a possible implementation, a shape of the elastic mechanical part may include but is not limited to at least one of the following shapes:

an M-shape, a W-shape, a V-shape, a zigzag, an inverted V-shape, and a fold line shape.

In a possible implementation, the stress relief portion may include a slot, where the slot is located on a side of the solder joint on the phase shifter and close to a central position of the PCB. In this implementation, the slot is a specific implementation of the stress relief portion. The slot is used to cut the stress generated due to the different coefficients of thermal expansion of the cavity and the PCB. Optionally, the solder joint is located at an end of the phase shifter.

In a possible implementation, a depth of the slot is greater than or equal to H, the depth of the slot is less than or equal to a width of the PCB, and H is a half of the width of the PCB.

In a possible implementation, the slot and the first strip on the PCB are independent of each other.

In a possible implementation, the first strip is a suspended strip.

According to a sixth aspect, an embodiment of this application provides an antenna, including a phase shifter, where the phase shifter includes:

a cavity and a built-in PCB thereof; and a slot, where the slot is located on a side of a solder joint on the phase shifter and close to a central position of the PCB, and the slot is configured to reduce a stress generated due to different coefficients of thermal expansion of the cavity and the PCB.

Because the slot can be configured to reduce the stress generated due to the different coefficients of thermal expansion of the cavity and the PCB, the slot is added in the phase shifter, and the slot is located on the side of the solder joint on the phase shifter and close to the central position of the PCB. The slot is used to cut the stress generated due to the different coefficients of thermal expansion of the cavity and the PCB, to avoid tearing of the solder joint on the phase shifter, thereby ensuring electrical performance stability of the phase shifter.

In a possible implementation, a depth of the slot is greater than or equal to H, the depth of the slot is less than or equal to a width of the PCB, and H is a half of the width of the PCB or another width.

In a possible implementation, the slot and a first strip on the PCB are independent of each other.

According to a seventh aspect, an embodiment of this application provides an antenna, including a phase shifter, where the phase shifter includes:
  a cavity and a built-in PCB thereof; and
  a structural connection portion, where the structural connection portion is structurally connected to a second strip on the PCB, a first strip and the second strip are independent of each other, and the first strip is used for internal conduction of the phase shifter; and the structural connection portion is configured to reduce a stress generated due to different coefficients of thermal expansion of the cavity and the PCB.

Because the structural connection portion can be configured to reduce the stress generated due to the different coefficients of thermal expansion of the cavity and the PCB, the structural connection portion is added in the phase shifter, and the structural connection portion is structurally connected to the second strip on the PCB. The first strip and the second strip are independent of each other, and the first strip is used for the internal conduction of the phase shifter. The structural connection portion is used to protect a solder joint and block the stress generated due to the different coefficients of thermal expansion of the cavity and the PCB, to avoid tearing of the solder joint on the phase shifter, thereby ensuring electrical performance stability of the phase shifter.

In a possible implementation, the structural connection portion is close to the solder joint. Optionally, the solder joint is a solder joint located at any end of the phase shifter.

According to an eighth aspect, an embodiment of this application provides an antenna, including a phase shifter, where the phase shifter includes:
  a cavity and a built-in PCB thereof; and
  an elastic mechanical part, where the elastic mechanical part is electrically connected to a first strip on the PCB, the first strip is used for internal conduction of the phase shifter, and the elastic mechanical part is configured to reduce a stress generated due to different coefficients of thermal expansion of the cavity and the PCB.

Because the elastic mechanical part can be configured to reduce the stress generated due to the different coefficients of thermal expansion of the cavity and the PCB, the elastic mechanical part is added in the phase shifter, and the elastic mechanical part is electrically connected to the first strip on the PCB. The first strip is used for the internal conduction of the phase shifter. The elastic mechanical part is used to absorb the stress generated due to the different coefficients of thermal expansion of the cavity and the PCB, to avoid tearing a solder joint on the phase shifter, thereby ensuring electrical performance stability of the phase shifter.

In a possible implementation, one end of the elastic mechanical part is electrically connected to an inner core of an external cable, an outer conductor of the external cable is electrically connected to the cavity, and the other end of the elastic mechanical part is electrically connected to the first strip.

In a possible implementation, one end of the elastic mechanical part is electrically connected to an inner core of an adapter, the inner core of the adapter is connected to an inner core of an external cable, an outer conductor of the external cable is electrically connected to the cavity, and the other end of the elastic mechanical part is electrically connected to the first strip.

In a possible implementation, a shape of the elastic mechanical part may include but is not limited to at least one of the following shapes: an M-shape, a W-shape, a V-shape, a zigzag, an inverted V-shape, a fold line shape, or the like.

According to a ninth aspect, an embodiment of this application provides a base station, including the antenna according to any one of the fifth aspect, the sixth aspect, the seventh aspect, or the eighth aspect.

The foregoing and other aspects of this application are clearer and easier to understand in descriptions of the following (a plurality of) embodiments.

DESCRIPTION OF EMBODIMENTS

Figure 1:
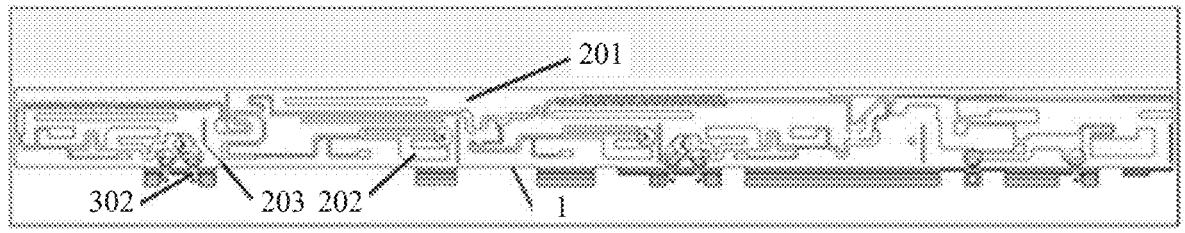
FIG. 1 is a top view of a phase shifter according to an embodiment of this application.

The following describes embodiments of this application in detail. Examples of the embodiments are shown in the accompanying drawings. Same or similar reference signs are always used to represent same or similar elements or elements having same or similar functions. The embodiments described below with reference to the accompanying drawings are examples, and are merely used to explain this application, but cannot be understood as a limitation on this application.

In the descriptions of the embodiments of this application, it should be understood that direction or location relationships indicated by terms "upper", "on", "below", "front", "rear", "vertical", "horizontal, "bottom", "inner", "outer", or the like are direction or location relationships shown based on the accompanying drawings, and are merely intended to conveniently describe this application and simplify the description, but are not intended to indicate or imply that an apparatus or an element needs to have a particular direction and needs to be constructed and operated in the particular direction. Therefore, such terms cannot be understood as a limitation on the embodiments of this application. In the descriptions of the embodiments of this application, unless otherwise specifically specified, "a plurality of" means two or more.

In the descriptions of the embodiments of this application, it should be noted that, unless otherwise clearly specified and limited, terms "link", "connect", and "connection" should be understood in a broad sense. For example, the terms may be used for a fixed connection, a connection through intermediate media, an internal connection between two elements, or an interaction relationship between two elements. Persons of ordinary skill in the art may understand specific meanings of the terms in the embodiments of this application based on specific cases.

In the specification, claims, and accompanying drawings of the embodiments of this application, terms such as "first", "second", and "third" are intended to distinguish between similar objects but do not necessarily indicate a specific order or sequence. It should be understood that the data termed in such a way are interchangeable in proper circumstances, so that the embodiments of this application described herein can be implemented in orders except the order illustrated or described herein. Moreover, the terms "include", "have" and any other variants mean to cover the non-exclusive inclusion, for example, a process, method, system, product, or device that includes a list of steps or units is not necessarily limited to those steps or units, but may include other steps or units not expressly listed or inherent to such a process, method, product, or device.

A coefficient of thermal expansion is used to indicate the extent to which an object expands and contracts due to temperature changes "或" A coefficient of thermal expansion is a physical quantity that measures the degree of thermal expansion of a solid material. "Ability of an object to change is expressed by a change of a length value caused by a change of a unit temperature under constant pressure, that is, the coefficient of thermal expansion. Coefficients of thermal expansion of objects are different, and generally a unit of a coefficient of thermal expansion of a metal is 1/degree Celsius. In most cases, this coefficient is positive. That is, a temperature change is proportional to a length change, and a volume increases as a temperature rises. However, there are exceptions, such as negative expansion of water between 0 and 4 degrees Celsius. However, geometrical characteristics of some ceramic materials are almost not changed when a temperature rises. Coefficients of thermal expansion of the ceramic materials are close to 0.

In a long-term temperature cycle test, a high-temperature environment and a low-temperature environment alternately occur. Generally, a common material is subject to a phenomenon of thermal expansion and cold contraction, and there is large or small deformation. A magnitude of the deformation is closely correlated to the coefficient of thermal expansion of the material.

In a practical application, two materials whose coefficients of thermal expansion differ greatly are usually electrically connected to each other to implement a specific function. During the long-term temperature cycle test, because the coefficients of thermal expansion of the two materials differ greatly, deformation of the two materials is inconsistent. In this case, a portion used for implementation of an electrical connection between the two materials is subject to a stress generated by the different deformation. A magnitude of the stress is related to a difference between the coefficients of thermal expansion of the two materials, and also to relative positions of the electrical connection portion to the two materials. For example, as described above, when a coefficient of thermal expansion of a cavity of a phase shifter is inconsistent with a coefficient of thermal expansion of an internal conductive apparatus of the phase shifter, solder joints distributed at two ends of the phase shifter are more likely to tear as a distance between the two ends increases, affecting electrical performance stability of the phase shifter.

For the foregoing problem, the embodiments of this application provide a phase shifter. A stress relief portion is added in the phase shifter, and the stress relief portion is configured to reduce a stress generated due to different coefficients of thermal expansion of a cavity of the phase shifter and an internal conductive apparatus of the phase shifter, to avoid tearing of a solder joint on the phase shifter, thereby ensuring electrical performance stability of the phase shifter.

Specifically, an embodiment of this application provides a phase shifter, including a cavity, a built-in printed circuit board (PCB) thereof, and a stress relief portion. The stress relief portion is connected to the PCB, and the stress relief portion is configured to reduce a stress generated due to different coefficients of thermal expansion of the cavity and the PCB.

The PCB herein is the foregoing internal conductive apparatus.

Optionally, a first strip may be a suspended strip.

In the phase shifter, the coefficients of thermal expansion of the PCB and the cavity are different. When a long-term temperature cycle test is performed or the phase shifter is located in an area with a large temperature difference between day and night and is used for a long time, because a high-temperature environment and a low-temperature environment alternately occur, an electrical connection at a side edge is subject to the stress. Consequently, invalidation of the electrical connection is caused. However, after the stress relief portion is added, the stress generated due to the different coefficients of thermal expansion of the cavity and the PCB can be cut, buffered, or blocked by the stress relief portion, to reduce or eliminate the stress and avoid tearing of the solder joint on the phase shifter, thereby ensuring electrical performance stability of the phase shifter.

It should be noted that the solder joint in the embodiments of this application are not limited to the solder joints located at any end of the phase shifter. When a distance between two solder joints is relatively long, for example, is greater than a preset value, the stress relief portion described herein may be added near the two solder joints.

The following further describes the phase shifter provided in the embodiments of this application with reference to the accompanying drawings and embodiments. It should be additionally noted that implementations of this application include but are not limited to the following embodiments.

In a first implementation, at least one slot is added on one material near an electrical connection portion that is greatly affected by a stress. In this implementation, the stress relief portion is the slot. That is, the slot is a specific implementation of the stress relief portion. The slot is used to protect a solder joint and cut the stress generated due to the different codficients of thermal expansion of the cavity and the PCB.

Figure 2:
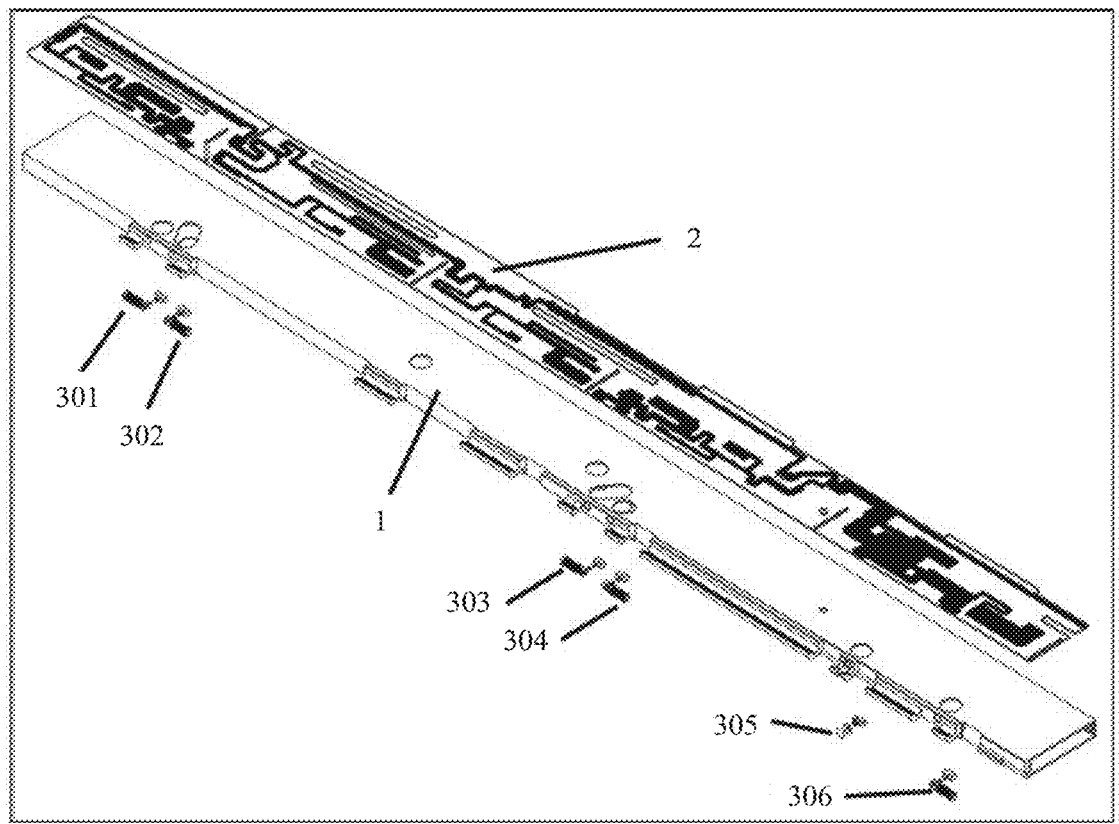
FIG. 2 is an assembly diagram of a phase shifter according to an embodiment of this application.
Figure 3:
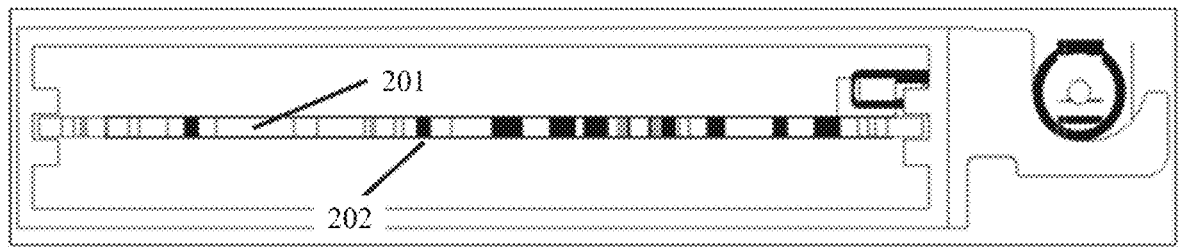
FIG. 3 is a side view of a phase shifter according to an embodiment of this application.

FIG. 1 is a top view of a phase shifter according to an embodiment of this application. FIG. 2 is an assembly diagram of a phase shifter according to an embodiment of this application. FIG. 3 is a side view of a phase shifter according to an embodiment of this application.

Refer to FIG. 1, FIG. 2, and FIG. 3. The phase shifter includes a cavity 1, a built-in PCB 2 thereof, and a slot 203. The slot 203 is located on a side of a solder joint 302 and close to a central position of the PCB 2.

Specifically, the slot 203 is disposed on a PCB substrate 201 near the solder joint 302, to reduce or cut impact of the stress on the solder joint 302, so that the solder joint 302 is protected, and tearing of the solder joint 302 is avoided, thereby ensuring electrical performance stability of the phase shifter.

As shown in FIG. 2, reference numerals "301", "303", "304", "305", and "306" are all used to indicate portions that implement an electrical connection between a PCB strip and a cavity. For example, the foregoing reference numerals all indicate a solder joint, that is, a solder joint 301, a solder joint 303, a solder joint 304, a solder joint 305, and a solder joint 306. The solder joint 305 is grounded and has a lightning protection function, and other solder joints have a signal transmission function. Therefore, the solder joint 305 is structurally different from the other solder joints. It is additionally noted that in the foregoing solder joints, the solder joint 301, the solder joint 302, and the solder joint 306 are closer to two ends of the phase shifter than other solder joints. Therefore, the three solder joints are more affected by the stress. In this embodiment of this application, only the solder joint 302 is used as an example for description.

In some embodiments, a depth of the slot 203 is greater than or equal to H, the depth of the slot 203 is less than or equal to a width of the PCB2, and H may be a half of the width of the PCB 2.

Optionally, the slot 203 and a first strip 202 on the PCB 2 are independent of each other.

In a second implementation, at least one structural connection portion is added near an electrical connection portion that is greatly affected by a stress. The structural connection portion implements only a structural connection, that is, the structural connection portion does not affect electrical performance of the phase shifter. In this implementation, the stress relief portion is the structural connection portion. That is, the structural connection portion is a specific implementation of the stress relief portion. The structural connection portion is used to protect a solder joint and block the stress generated due to the different coefficients of thermal expansion of the cavity and the PCB.

Figure 4:
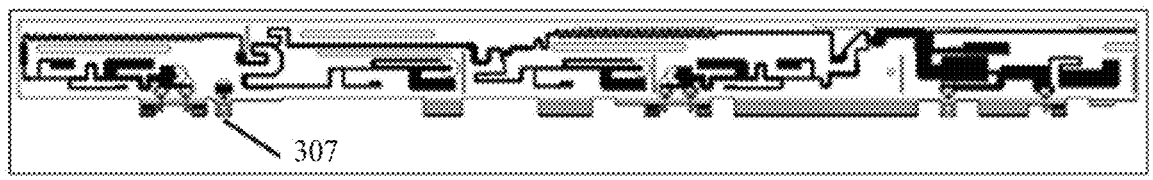
FIG. 4 is a top view of a phase shifter according to another embodiment of this application.
Figure 5:
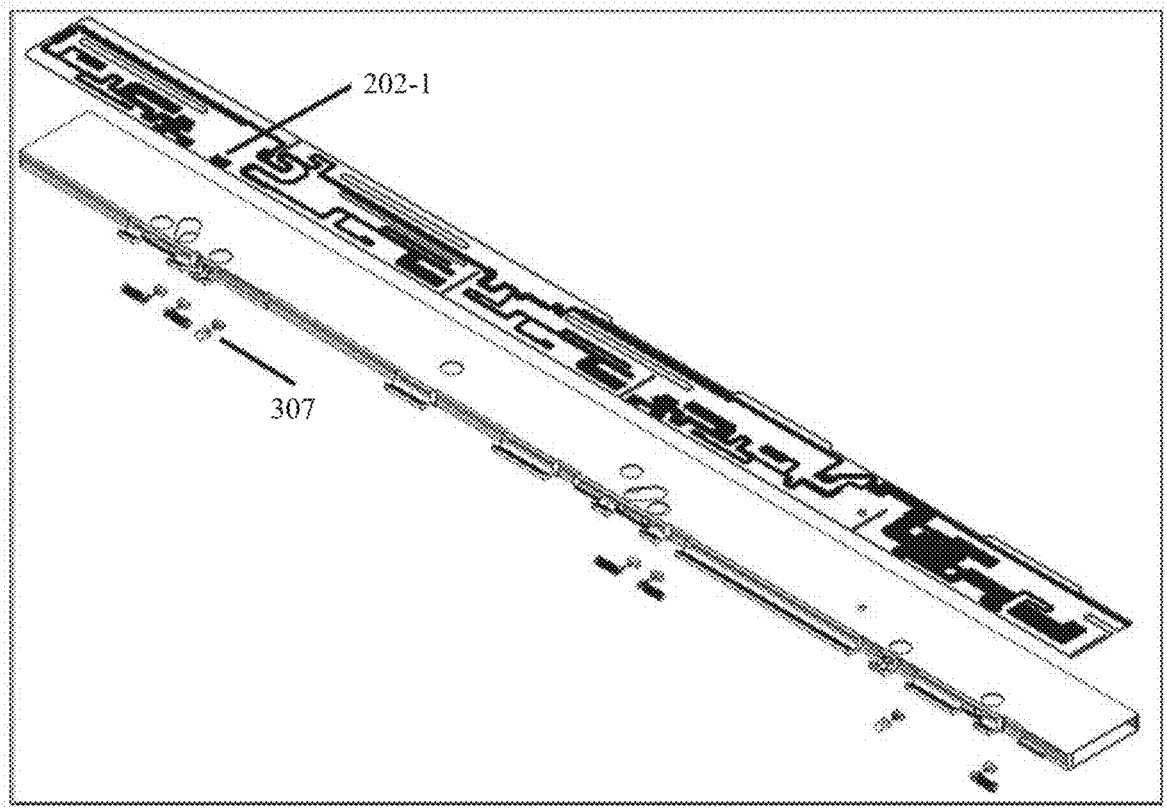
FIG. 5 is an assembly diagram of a phase shifter according to another embodiment of this application.

FIG. 4 is a top view of a phase shifter according to another embodiment of this application. FIG. 5 is an assembly diagram of a phase shifter according to another embodiment of this application.

Refer to FIG. 1, FIG. 2, FIG. 4 and FIG. 5. The phase shifter includes a cavity 1, a built-in PCB 2 thereof, and a structural connection portion 307. The structural connection portion 307 is structurally connected to a second strip 202-1 on the PCB 2, a first strip 202 and the second strip 202-1 are independent of each other, and the first strip 202 is used for internal conduction of the phase shifter.

The first strip 202 is a strip disposed on a PCB substrate 201 with a plating through hole (PTH), The PTH is a through hole with copper on its inner wall, and therefore can conduct electricity. The second strip 202-1 is an isolated metal strip disposed on the PCB substrate 201, and the second strip 202-1 is only used for a structural connection and is not used for conducting electricity.

Optionally, the structural connection portion 307 is close to the solder joint 302.

Optionally, the solder joint 302 is a solder joint located at any end of the phase shifter.

In this implementation, the structural connection portion 307 that implements only a structural connection is added next to the solder joint 302, and the structural connection portion 307 bears a stress generated due to different coefficients of thermal expansion of the cavity and the PCB, to play a function similar to a protective sleeve, so that the solder joint 302 is protected, and tearing of the solder joint 302 is avoided, thereby ensuring electrical performance stability of the phase shifter.

In a third implementation, at least one elastic mechanical part is added, as a buffer, to an electrical connection position that is greatly affected by a stress, thereby reducing or eliminating influence of the stress. In this implementation, the stress relief portion is the elastic mechanical part. That is, the elastic mechanical part is a specific implementation of the stress relief portion. The elastic mechanical part absorbs the stress generated due to different coefficients of thermal expansion of the cavity and the PCB, to protect a solder joint, thereby ensuring that the solder joint herein works normally.

Figure 6:
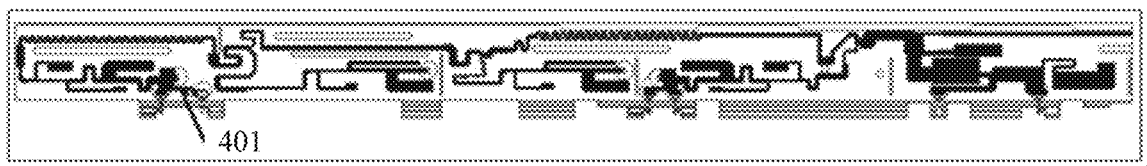
FIG. 6 is a top view of a phase shifter according to still another embodiment of this application.
Figure 7:
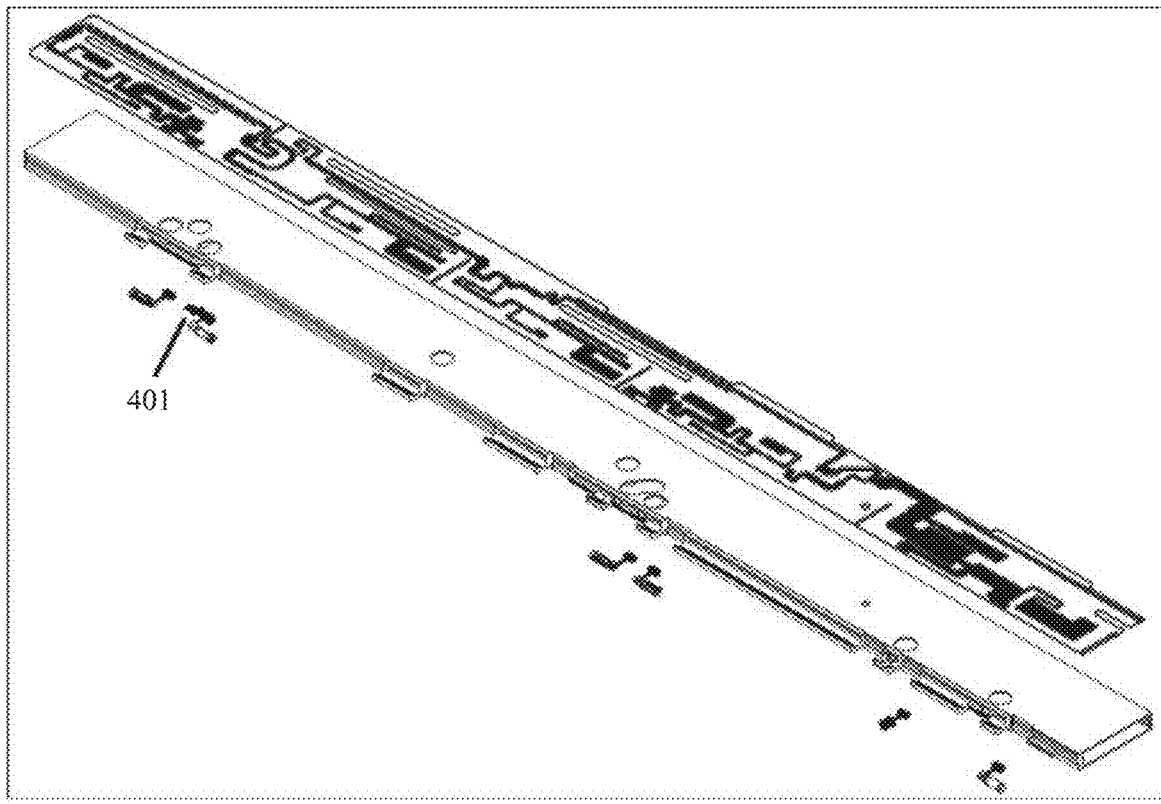
FIG. 7 is an assembly diagram of a phase shifter according to still another embodiment of this application.
Figure 8:
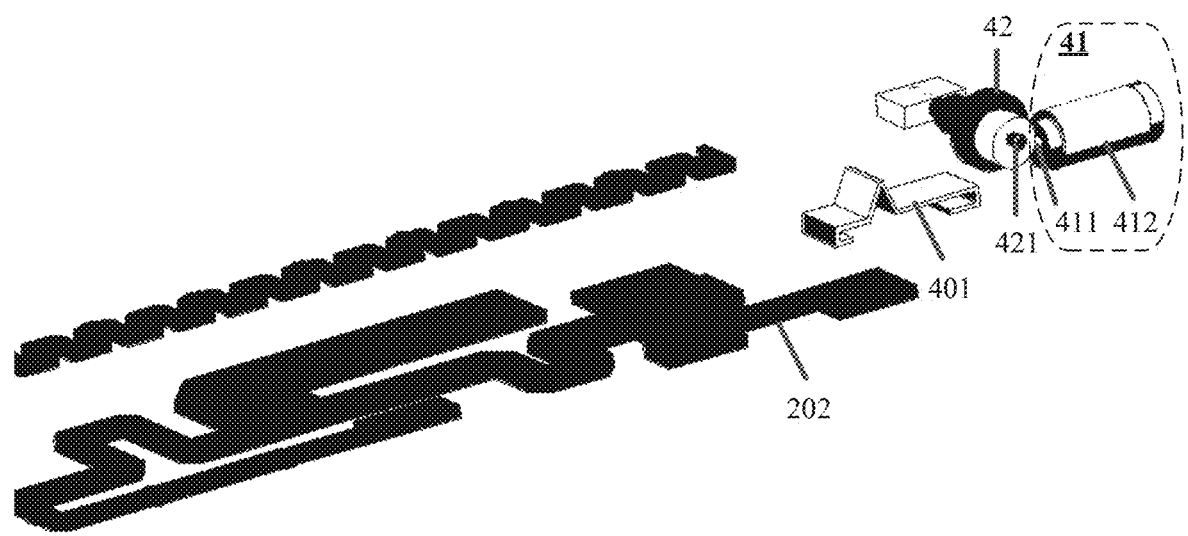
FIG. 8 is a partial enlarged view of an assembly diagram of a phase shifter according to still another embodiment of this application.
Figure 9:
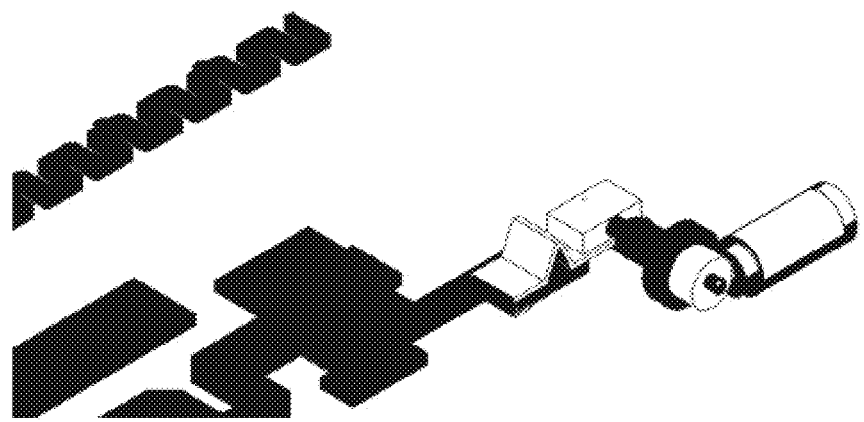
FIG. 9 is a schematic diagram of a connection relationship of an elastic mechanical part in a phase shifter according to still another embodiment of this application.

FIG. 6 is a top view of a phase shifter according to still another embodiment of this application. FIG. 7 is an assembly diagram of a phase shifter according to still another embodiment of this application. FIG. 8 is a partial enlarged view of an assembly diagram of a phase shifter according to still another embodiment of this application, FIG. 9 is a schematic diagram of a connection relationship of an elastic mechanical part in a phase shifter according to still another embodiment of this application.

Refer to FIG. 1, FIG. 2, and FIG. 6 to FIG. 9. The phase shifter includes a cavity 1, a built-in PCB 2 thereof, and an elastic mechanical part 401. The elastic mechanical part 401 is electrically connected to a first strip 202 on the PCB 2, and the first strip 202 is used for internal conduction of the phase shifter.

In some embodiments, one end of the elastic mechanical part 401 is electrically connected to an inner core 411 of an external cable 41, an outer conductor 412 of the external cable 41 is electrically connected to the cavity 1, and the other end of the elastic mechanical part 401 is electrically connected to the first strip 202.

It should be additionally noted that an adapter 42 shown in FIG. 8 (a block at an end of the adapter 42 indicates a solder joint, which does not belong to the external cable 41 or to the adapter 42) is not necessary for the embodiments of this application. In other words, it is sufficient to ensure that the inner core 411 of the external cable 41 is electrically connected to one end of the elastic mechanical part 401, and the outer conductor 412 of the external cable 41 is electrically connected to the cavity 1. The adapter 42 is optional. Specifically, in an implementation, when there is an adapter 42 shown in FIG. 8, the inner core 411 of the external cable 41 is connected to the inner core 421 of the adapter 42. The inner core 421 is electrically connected to the elastic mechanical part 401 by a soldering manner (the solder joint indicated by the block). In another implementation, an adapter 42 is not required, and the inner core 411 of the external cable 41 is directly electrically connected to the elastic mechanical part 401 by the soldering manner.

In this implementation, at least one elastic mechanical part 401 is added to the solder joint 302, and the elastic mechanical part 401 bears a stress generated due to different coefficients of thermal expansion of the cavity and the PCB, to protect the solder joint 302, and avoid tearing of the solder joint 302, thereby ensuring electrical performance stability of the phase shifter.

Figure 10:
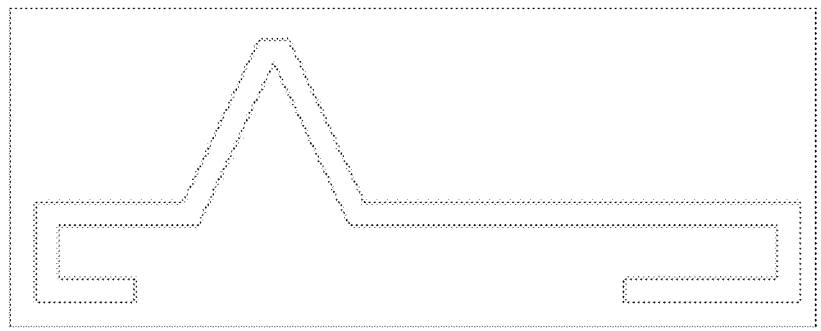
FIG. 10 is a side view of an elastic mechanical part in a phase shifter according to still another embodiment of this application.
Figure 11:
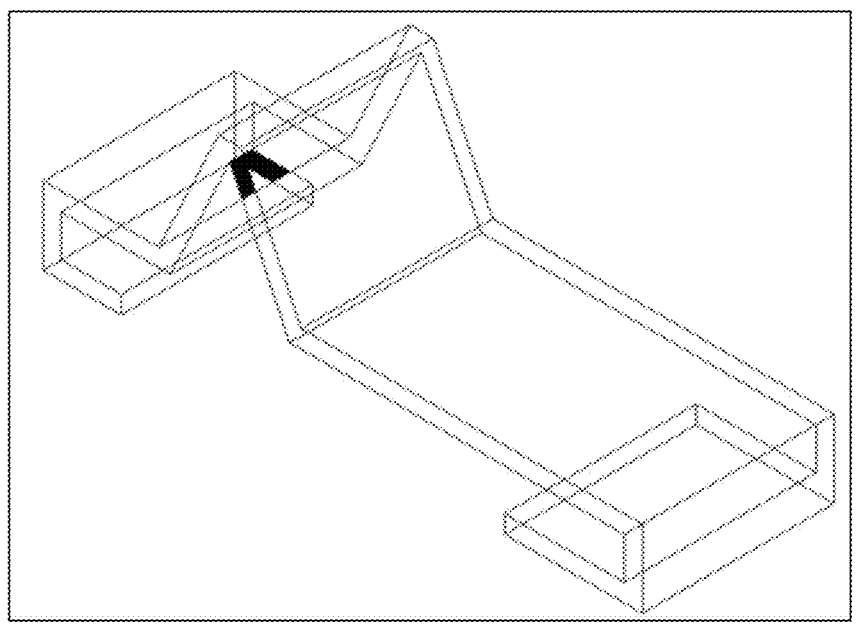
FIG. 11 is an oblique 45° view of an elastic mechanical part in a phase shifter according to still another embodiment of this application.

Optionally, a shape of the elastic mechanical part 401 may include but is not limited to at least one of the following shapes: an M-shape, a W-shape, a V-shape, a zigzag, an inverted V-shape, a fold line shape, or the like. For example, FIG. 10 shows a side view of an elastic mechanical part, and FIG. 11 shows an oblique 45° view of the elastic mechanical part, where the elastic mechanical part has an inverted V-shape.

The foregoing phase shifter may implement antennas of different forms by using different combinations. Based on the foregoing embodiments, in the following embodiment, the phase shifter is implemented by using different forms of combinations and is used in an antenna.

An embodiment of this application provides an antenna, including a phase shifter. The phase shifter includes:
a cavity and a built-in PCB thereof; and
a stress relief portion, where the stress relief portion is connected to the PCB, and the stress relief portion is configured to reduce a stress generated due to different coefficients of thermal expansion of the cavity and the PCB.

Because the stress relief portion can be configured to reduce the stress generated due to the different coefficients of thermal expansion of the cavity and the PCB, adding the stress relief portion in the phase shifter can avoid tearing a solder joint on the phase shifter, thereby ensuring electrical performance stability of the phase shifter.

Optionally, the stress relief portion may include a structural connection portion, where the structural connection portion is structurally connected to a second strip on the PCB, a first strip and the second strip are independent of each other, and the first strip is used for internal conduction of the phase shifter. That is, the structural connection portion is a specific implementation of the stress relief portion. The structural connection portion is used to protect a solder joint and block the stress generated due to the different coefficients of thermal expansion of the cavity and the PCB.

Further, the structural connection portion is close to the solder joint.

Optionally, the solder joint is a solder joint located at any end of the phase shifter.

Optionally, the stress relief portion may include an elastic mechanical part. The elastic mechanical part is electrically connected to the first strip on the PCB, and the first strip is used for the internal conduction of the phase shifter. In this implementation, the elastic mechanical part is a specific implementation of the stress relief portion. The elastic mechanical part is used to absorb the stress generated due to the different coefficients of thermal expansion of the cavity and the PCB.

In some embodiments, one end of the elastic mechanical part is electrically connected to an inner core of an external cable, an outer conductor of the external cable is electrically connected to the cavity, and the other end of the elastic mechanical part is electrically connected to the first strip.

Alternatively, one end of the elastic mechanical part is electrically connected to an inner core of an adapter, the inner core of the adapter is connected to an inner core of an external cable, an outer conductor of the external cable is electrically connected to the cavity, and the other end of the elastic mechanical part is electrically connected to the first strip.

Further, a shape of the elastic mechanical part may include but is not limited to at least one of the following shapes: an M-shape, a W-shape, a V-shape, a zigzag, an inverted V-shape, a fold line shape, or the like.

Optionally, the stress relief portion may include a slot, where the slot is located on a side of a solder joint on the PCB and close to a central position of the PCB. In this implementation, the slot is a specific implementation of the stress relief portion. The slot is used to cut the stress generated due to the different coefficients of thermal expansion of the cavity and the PCB.

Optionally, the solder joint is a solder joint located at an end of the phase shifter.

Further, a depth of the slot is greater than or equal to H, the depth of the slot is less than or equal to a width of the PCB, and H is a half of the width of the PCB.

The slot and the first strip on the PCB are independent of each other.

It should be further noted that the first strip is a suspended strip.

An embodiment of this application further provides a base station, where the base station includes an antenna. The antenna includes a phase shifter. The phase shifter may be implemented in different manners. Specifically, a structure of the phase shifter described in this embodiment of this application is described below by adding one or more of a slot, a structural connection portion, and an elastic mechanical part to a conventional phase shifter.

In an implementation, the phase shifter includes:
a cavity and a built-in PCB thereof, and
a slot, where the slot is located on a side of a solder joint on the phase shifter and close to a central position of the PCB, and the slot is configured to reduce a stress generated due to different coefficients of thermal expansion of the cavity and the PCB.

Because the slot can be configured to reduce the stress generated due to the different coefficients of thermal expansion of the cavity and the PCB, the slot is added in the phase shifter, and the slot is located on the side of the solder joint and close to the central position of the PCB. The slot is used to cut the stress generated due to the different coefficients of thermal expansion of the cavity and the PCB, to avoid tearing of the solder joint on the phase shifter, thereby ensuring electrical performance stability of the phase shifter.

Optionally, the solder joint is a solder joint located at an end of the phase shifter.

Further, a depth of the slot is greater than or equal to H, the depth of the slot is less than or equal to a width of the PCB, and H is a half of the width of the PCB or another width.

The slot and the first strip on the PCB are independent of each other.

In another implementation, the phase shifter includes:
a cavity and a built-in PCB thereof and
a structural connection portion, where the structural connection portion is structurally connected to a second strip on the PCB, a first strip and the second strip are independent of each other, and the first strip is used for internal conduction of the phase shifter; and the structural connection portion is configured to reduce a stress generated due to different coefficients of thermal expansion of the cavity and the PCB.

Because the structural connection portion can be configured to reduce the stress generated due to the different coefficients of thermal expansion of the cavity and the PCB, the structural connection portion is added in the phase shifter, and the structural connection portion is structurally connected to the second strip on the PCB. The first strip and the second strip are independent of each other. The structural connection portion is used to protect a solder joint and block the stress generated due to the different coefficients of thermal expansion of the cavity and the PCB, to avoid tearing of the solder joint on the phase shifter, thereby ensuring electrical performance stability of the phase shifter.

Further, the structural connection portion is close to the solder joint.

Optionally, the solder joint is a solder joint located at any end of the phase shifter.

In still another implementation, the phase shifter includes:
a cavity and a built-in PCB thereof; and
an elastic mechanical part, where the elastic mechanical part is electrically connected to a first strip on the PCB, the first strip is used for internal conduction of the phase shifter, and the elastic mechanical part is configured to reduce a stress generated due to different coefficients of thermal expansion of the cavity and the PCB.

Because the elastic mechanical part can be configured to reduce the stress generated due to the different coefficients of thermal expansion of the cavity and the PCB, the elastic mechanical part is added in the phase shifter, and the elastic mechanical part is electrically connected to the first strip on the PCB. The first strip is used for the internal conduction of the phase shifter. The elastic mechanical part is used to absorb the stress generated due to the different coefficients of thermal expansion of the cavity and the PCB, to avoid tearing a solder joint on the phase shifter, thereby ensuring electrical performance stability of the phase shifter.

In some embodiments, one end of the elastic mechanical part is electrically connected to an inner core of an external cable, an outer conductor of the external cable is electrically connected to the cavity, and the other end of the elastic mechanical part is electrically connected to the first strip.

Alternatively, one end of the elastic mechanical part is electrically connected to an inner core of an adapter, the inner core of the adapter is connected to an inner core of an external cable, an outer conductor of the external cable is electrically connected to the cavity, and the other end of the elastic mechanical part is electrically connected to the first strip.

Further, a shape of the elastic mechanical part may include but is not limited to at least one of the following shapes: an M-shape, a W-shape, a V-shape, a zigzag, an inverted V-shape, a fold line shape, or the like.

Although only some components and embodiments of this application have been illustrated and described, without actually departing from the scope and spirit of the claims, persons skilled in the art may consider many modifications and changes (for example, changes in magnitudes, sizes, structures, shapes and ratios, installation arrangements, used materials, colors, orientations, and the like of elements). In addition, to provide a brief description of the example embodiments, all components (namely, components that are currently considered to be irrelevant to an optimal resonance mode for performing this application or components that are irrelevant to implementing the claimed invention) in an actual implementation may not be described. It should be understood that in the development of any such actual implementation, as in any project or design project, several specific implementation decisions may be made. Such development may be complex and time-consuming, but for persons of ordinary skill who benefit from this application, it will still be a routine for design, processing, and manufacturing, without excessive experiments.

Finally, it should be noted that the foregoing embodiments are merely used to describe the technical solutions of this application, but are not intended to limit the technical solutions. Although the embodiments of this application are described in detail with reference to the foregoing embodiments, persons of ordinary skill in the art should understand that the technical solutions recorded in the foregoing embodiments may still be modified, or some or all technical features thereof may be equivalently replaced. These modifications or replacements do not depart from the scope of the technical solutions in the embodiments of this application.

What is claimed is:

1. A phase shifter, comprising a cavity and a built-in printed circuit board (PCB) in the cavity, wherein the phase shifter further comprises:
a stress relief portion, wherein the stress relief portion is connected to the PCB, wherein the stress relief portion is configured to reduce a stress generated due to different coefficients of thermal expansion (CTE) of the cavity and the PCB, and wherein the stress relief portion comprises:
a structural connection portion, wherein the structural connection portion is structurally connected to a second strip on the PCB, wherein a first strip and the second strip are independent of each other, and wherein the first strip is used for internal conduction of the phase shifter; or
an elastic mechanical part, wherein the elastic mechanical part is electrically connected to a first strip on the PCB, and wherein the first strip is used for internal conduction of the phase shifter.

2. The phase shifter according to claim 1, wherein the stress relief portion comprises the structural connection portion, and the structural connection portion is adjacent to a solder joint.

3. The phase shifter according to claim 1, wherein the stress relief portion comprises the elastic mechanical part, and a shape of the elastic mechanical part comprises at least one of an M-shape, a W-shape, a V-shape, a zigzag, an inverted V-shape, or a fold line shape.

4. An antenna, comprising a phase shifter, wherein the phase shifter comprises a cavity, a built-in printed circuit board (PCB) in the cavity, and a stress relief portion, wherein the stress relief portion is connected to the PCB, wherein the stress relief portion is configured to reduce a stress generated due to different coefficients of thermal expansion (CTE) of the cavity and the PCB, and wherein the stress relief portion comprises:
a structural connection portion, wherein the cavity is structurally connected to a second strip on the PCB by using the structural connection portion, wherein a first strip and the second strip are independent of each other, and wherein the first strip is used for internal conduction of the phase shifter; or
an elastic mechanical part, wherein the elastic mechanical part is electrically connected to a first strip on the PCB, and wherein the first strip is used for internal conduction of the phase shifter.

5. The antenna according to claim 4, wherein the stress relief portion comprises the structural connection portion, and the structural connection portion is adjacent to a solder joint.

6. The antenna according to claim 4, wherein the stress relief portion comprises the elastic mechanical part, and a shape of the elastic mechanical part comprises at least one of an M-shape, a W-shape, a V-shape, a zigzag, an inverted V-shape, or a fold line shape.

7. A base station, comprising an antenna, wherein the antenna comprises a phase shifter, wherein the phase shifter comprises a cavity, a built-in printed circuit board (PCB) in the cavity, and a stress relief portion, wherein the stress relief portion is connected to the PCB, wherein the stress relief portion is configured to reduce a stress generated due to different coefficients of thermal expansion (CTE) of the cavity and the PCB, and wherein the stress relief portion comprises:

a structural connection portion, wherein the cavity is structurally connected to a second strip on the PCB by using the structural connection portion, wherein a first strip and the second strip are independent of each other, and wherein the first strip is used for internal conduction of the phase shifter; or an elastic mechanical part, wherein the elastic mechanical part is electrically connected to a first strip on the PCB, and wherein the first strip is used for internal conduction of the phase shifter.

8. The base station according to claim 7, wherein the stress relief portion comprises the structural connection portion, and the structural connection portion is adjacent to a solder joint.

9. The base station according to claim 7, wherein the stress relief portion comprises the elastic mechanical part, and a shape of the elastic mechanical part comprises at least one of an M-shape, a W-shape, a V-shape, a zigzag, an inverted V-shape, or a fold line shape.

* * * * *